(12) United States Patent
Harayama

(10) Patent No.: US 11,141,933 B2
(45) Date of Patent: Oct. 12, 2021

(54) SHAPING APPARATUS, SHAPING METHOD, AND SHAPED OBJECT

(71) Applicant: MIMAKI ENGINEERING CO., LTD., Nagano (JP)

(72) Inventor: Kenji Harayama, Nagano (TW)

(73) Assignee: MIMAKI ENGINEERING CO., LTD., Nagano (JP)

( * ) Notice: Subject to any disclaimer, the term of this patent is extended or adjusted under 35 U.S.C. 154(b) by 87 days.

(21) Appl. No.: 16/527,004

(22) Filed: Jul. 30, 2019

(65) Prior Publication Data

US 2020/0047429 A1    Feb. 13, 2020

(30) Foreign Application Priority Data

Aug. 13, 2018   (JP) .............................. JP2018-152245

(51) Int. Cl.
*B29C 67/00* (2017.01)
*B29C 64/135* (2017.01)
*B29C 64/209* (2017.01)
*G06F 30/00* (2020.01)

(52) U.S. Cl.
CPC ........ *B29C 67/0007* (2013.01); *B29C 64/135* (2017.08); *B29C 64/209* (2017.08); *G06F 30/00* (2020.01); *B29C 2791/004* (2013.01)

(58) Field of Classification Search
CPC ... B29C 67/007; B29C 64/135; B29C 64/209; B29C 2791/004; B29C 64/393; B29C 64/336; B29C 64/112; B33Y 50/02; B33Y 10/00; G06F 30/00
See application file for complete search history.

(56) References Cited

U.S. PATENT DOCUMENTS

| | | | |
|---|---|---|---|
| 2017/0100896 A1* | 4/2017 | Hakkaku | B33Y 30/00 |
| 2017/0269475 A1* | 9/2017 | Kuo | G06F 3/12 |
| 2017/0274587 A1* | 9/2017 | Hakkaku | B29C 64/112 |
| 2017/0313048 A1* | 11/2017 | Hakkaku | B29C 64/209 |

FOREIGN PATENT DOCUMENTS

| | | | |
|---|---|---|---|
| JP | 2015071282 | 4/2015 | |
| WO | WO-2016031797 A1 * | 3/2016 | B29C 64/277 |

* cited by examiner

*Primary Examiner* — Santosh R Poudel
(74) *Attorney, Agent, or Firm* — JCIPRNET

(57) ABSTRACT

A shaping apparatus, a shaping method and a shaped object are provided. The shaping apparatus for shaping a shaped object that is stereoscopic and in which at least one part is colored is provided and includes: inkjet heads which are coloring heads that eject a coloring ink; an inkjet head which is a light reflective material head that ejects a white ink to become a light reflective material; and a controller. The shaped object including a region to be colored is shaped as the shaped object. At least a part of the region to be colored is formed by arranging a plurality of color cells set in advance as a unit of coloring. Each of the color cells includes a reflective core formed of the white ink, and an outer peripheral portion formed of the coloring ink.

10 Claims, 6 Drawing Sheets

SHAPING APPARATUS, SHAPING METHOD, AND SHAPED OBJECT

CROSS REFERENCE TO RELATED APPLICATIONS

This application claims the priority benefit of Japanese Patent Application No. 2018-152245, filed on Aug. 13, 2018. The entirety of the above-mentioned patent application is hereby incorporated by reference herein and made a part of this specification.

TECHNICAL FIELD

The present disclosure relates to a shaping apparatus, a shaping method, and a shaped object.

DESCRIPTION OF THE BACKGROUND ART

Conventionally, a shaping apparatus (3D printer) for shaping a shaped object using an inkjet head is known (see, e.g., Japanese Unexamined Patent Publication No. 2015-071282, Patent Literature 1). In such a shaping apparatus, for example, the shaped object is shaped through a layered shaping method by overlapping a plurality of layers of ink formed by an inkjet head.

Furthermore, when shaping a shaped object with such a shaping apparatus, for example, a colored shaped object can be shaped by shaping a shaped object including a region to be colored formed using inks of a plurality of colors. In this case, the region to be colored is formed, for example, using inks of a plurality of colors capable of representing various colors by subtractive color mixture at a part where the hue can be visually recognized from the outside of the shaped object (surface of the shaped object). Furthermore, in this case, light entering from the outside of the shaped object is reflected by forming a light reflecting region on an inner side of the region to be colored using a light reflective ink (e.g., white ink).

Patent Literature 1: Japanese Unexamined Patent Publication No. 2015-071282

SUMMARY

In a case in which the light reflecting region and the region to be colored are formed in the shaped object, various colors can be represented, for example, similar to a case in which printing is carried out with a color ink on a white paper, and the like. However, in the case in which a colored shaped object is to be shaped, the way the color appears may differ according to the position of the shaped object as the shaped object has a stereoscopic shape. More specifically, for example, when shaping a shaped object or the like in which at least a part of the surface has a planar shape, the color in the vicinity of the edge of the planar part is visually recognized to be deeper than the other parts, and an impression in which unnecessary contours may be seen may be obtained. Therefore, conventionally, it has been desired to more appropriately shape a shaped object when shaping a colored shaped object. The present disclosure thus provides a shaping apparatus, a shaping method, and a shaped object capable of overcoming such problem.

The inventor of the present application studied the cause of the difference in the way the color appears according to the position, and the like in a case of shaping a colored shaped object. In a configuration in which a region to be colored is formed at a periphery of the light reflecting region, it was found that a difference forms in the way the color appears as a large difference forms in the distance the light passes through the region to be colored. The inventor of the present application conducted an intensive research based on such findings, and found that the above problem can be solved by coloring a region to be colored in units of color cells of a predetermined configuration. In this case, a color cell is, for example, a unit of coloring composed of a plurality of ink dots of a predetermined number.

Furthermore, more specifically, the inventor of the present application considered giving a function of reflecting light to the region to be colored itself, for example, by including light reflective ink dots in the ink dots constituting the color cell. Moreover, in this case, the inventor considered forming a part to become the central core of the color cell with a light reflective ink such as white ink, and surrounding the outer peripheral portion at the periphery thereof with the inks of various colors. According to such a configuration, for example, the color of the color cell can be matched to a desired color by selecting the color of the ink used to form the outer peripheral portion. In this case, since the color cell includes a reflective core, most of the light that entered the region to be colored is reflected while the distance the light passes through the region to be colored is less than or equal to a certain degree. Therefore, according to such a configuration, for example, a large difference can be appropriately prevented from forming in the distance the light passes through the region to be colored. In addition, for example, a difference can be appropriately prevented from forming in the way the color appears according to the position of the shaped object.

The inventor of the present application has found, through further intensive research, the features necessary for obtaining such effects and contrived the present disclosure. In order to solve the problem described above, the present disclosure relates to a shaping apparatus for shaping a shaped object that is stereoscopic and in which at least one part is colored, the shaping apparatus including: a coloring head that ejects a coloring material as a material of the shaped object; a light reflective material head that ejects a light reflective material as a material of the shaped object; and a controller that controls operations of the coloring head and the light reflective material head. The shaped object including a region to be colored, which is a colored region, is shaped as the shaped object. At least a part of the region to be colored is formed by arranging a plurality of color cells set in advance as a unit of coloring. Each of the color cells includes a reflective core which is a part formed of the light reflective material inside the color cell, and an outer peripheral portion which is a part that surrounds a periphery of the reflective core. In an operation of forming the region to be colored, the controller causes the light reflective material head to eject the light reflective material to form the reflective core in each of the color cells, and causes the coloring head to eject the coloring material to form the outer peripheral portion in each of the color cells.

In such a configuration, for example, the function of reflecting light can be given to the region to be colored. Also, as a result, in this case, most of the light that entered the region to be colored is reflected while the distance the light passes through the region to be colored is less than or equal to a certain degree. Therefore, according to such a configuration, for example, a large difference can be appropriately prevented from forming in the distance the light passes through the region to be colored. In addition, for example, a difference can be appropriately prevented from forming in the way the color appears according to the position of the shaped object. Furthermore, in this case, the reflective core can be appropriately and uniformly distributed in the region to be colored by providing the reflective core in the color cell. Therefore, according to such a configuration, for example, the shaped object can be more appropriately shaped when shaping a colored shaped object.

Here, in such a configuration, the color cell can be considered as, for example, a unit or the like set in advance so as to include a plurality of dots formed by the material of the shaped object. In this case, the color cell is configured by, for example, a predetermined number of dots set in advance. Moreover, it is conceivable to use ink, for example, as a material of a shaped object. The ink is, for example, a functional liquid ejected from an ejection head (e.g., inkjet head etc.) that ejects liquid. In this case, as the light reflective material, for example, ink of light reflective color such as white can be suitably used.

Moreover, the coloring material is, for example, a material used to color a region to be colored to a desired color. It is conceivable to use a colored ink or the like, for example, as a coloring material. In addition, as the colored ink, for example, inks of each color of yellow (Y color), magenta (M color), cyan (C color), and black (K color) can be suitably used. In addition, it is also conceivable to use a colorless ink, for example, as a coloring material used to form a color cell. In this case, for example, consideration is made to use an ink of colorless and transparent clear color and the like as a coloring material. Moreover, in the shaped object, for example, consideration is also made to color one part of the region to be colored to white or the like. In such a case, consideration is also made to use, for example, a light reflective ink such as white color as a coloring material used to form a color cell. Furthermore, in this case, the light reflective material head can be assumed to also serve as a coloring head.

Moreover, in this configuration, it is conceivable to use, for example, a material that represents a color by a subtractive color mixing method as at least a part of the coloring material. Moreover, a shaping apparatus includes a plurality of coloring heads, each coloring head ejecting the coloring material of a color different from each other. In this case, at the time of forming the outer peripheral portion in the color cell formed at each position of the region to be colored, the controller causes at least a part of the plurality of coloring heads to eject the coloring material according to a color to be colored with respect to each position. With such a configuration, for example, various colors can be appropriately represented with the coloring material of a plurality of colors. Furthermore, in this configuration, the outer peripheral portion of one color cell is formed only of, for example, a coloring material of one color. With such a configuration, for example, the color cell showing the color of the coloring material can be appropriately formed. Moreover, in this case, for example, various colors can be appropriately represented using color cells in the same or similar manner as in the case of representing colors using the coloring material as it is.

In addition, for at least a part of the color cells in the region to be colored, for example, the outer peripheral portion in one color cell may be formed of a coloring material of a plurality of colors. When configured in such a manner, for example, the color of the color cell may be a color in which the coloring materials of a plurality of colors are mixed. Therefore, if configured in this manner, more various colors can be set for the color of the color cell. Moreover, for example, coloring with more various colors can be appropriately carried out on the region to be colored.

Moreover, the shaping apparatus preferably includes a coloring head that ejects a material of a clear color as the coloring material as at least one of the plurality of coloring heads. In this case, it is also conceivable to form the outer peripheral portion of one color cell with the coloring material of the plurality of colors including the material of the clear color. According to such a configuration, more various colors can be set for the color of the color cell. When a coloring head for the material of a clear color is used, a color cell in which the outer peripheral portion is formed only of a clear color material may be formed as at least a part of the color cells in the region to be colored. With such a configuration, for example, the region to be colored can be more appropriately colored by disposing a transparent color cell as needed.

Moreover, in this configuration, as the shaped object, a shaped object further including a light reflecting region other than the region to be colored can be considered. In this case, the light reflecting region is formed, for example, using a light reflective material on the inner side the region to be colored. With such a configuration, for example, the region to be colored can be formed only in the surface of a shaped object. Moreover, in this case, the region to be colored is preferably formed to a constant thickness on the surface of the shaped object. According to this configuration, for example, a difference can be more appropriately prevented from forming in the way the color appears according to the position of the shaped object.

Furthermore, in this case, it is conceivable to form, for example, a region configured by light reflective color cells as the light reflecting region. The light reflective color cell is, for example, a color cell in which both the reflective core and the outer peripheral portion are formed of a light reflective material. Moreover, in this case, the light reflective color cell is preferably made to the same size as the color cell in the region to be colored. According to such a configuration, for example, the processing related to the color cell can be performed on the region to be colored and the light reflecting region with the same or similar processing. Moreover, in the modified example of a shaped object, consideration is also made to not form the light reflecting region. In this case, for example, consideration is made to form a region on the inner side of the shaped object by a configuration that does not function as the light reflecting region. In this case as well, the light entering the region to be colored from outside the shaped object can be appropriately reflected by forming the region to be colored using a color cell including a reflective core. Thus, for example, various colors can be appropriately represented by the region to be colored. Furthermore, in a further modified example of the shaped object, a region to be colored also serving as a region inside the shaped object may be formed. In this case, it can be assumed that the shaped object is colored to the inside.

Furthermore, in this configuration, for example, the shaping apparatus shapes the shaped object by layering the material of the shaped object in the layering direction set in advance. Moreover, in this case, the shaping apparatus further includes, for example, a scanning driver that causes the coloring head and the light reflective material head to perform the scanning operation of relatively moving with respect to the shaped object being shaped. Then, the scanning driver causes the coloring head and the light reflective material head to perform at least the main scanning operation and the layering direction scanning as the scanning operation. In this case, the main scanning operation is, for example, a scanning operation of ejecting the material of the shaped object while relatively moving in the main scanning direction orthogonal to the layering direction with respect to the shaped object being shaped. Furthermore, the layering direction scanning is, for example, a scanning operation of relatively moving in the layering direction with respect to the shaped object being shaped.

Furthermore, in this case, it is conceivable to use a configuration in which the dots of the material of the shaped object are arranged by a number set in advance in the main scanning direction, the sub scanning direction, and the layering direction as color cells. In this case, the sub scanning direction is, for example, a direction orthogonal to the main scanning direction and the layering direction. More specifically, it is conceivable to set the number of dots arranged in each direction in one color cell to three. In this case, in each color cell, three dots of the material of the shaped object are arranged in each of the main scanning direction, the sub scanning direction, and the layering direction. Furthermore, in each color cell, the reflective core is constituted by the dot of the material of one shaped object at a position to become the center of the color cell. With this configuration, for example, the size of the color cell including the reflective core at the center can be minimized.

Use of a shaping method, a shaped object, and the like having the features similar to above can be considered for the configuration of the present disclosure. In this case as well, for example, effects similar to the above can be obtained. Furthermore, in this case, the shaping method can be considered as, for example, a manufacturing method for a shaped object.

According to the present disclosure, for example, the shaped object can be more appropriately shaped in a case where a colored shaped object is to be shaped.

BRIEF DESCRIPTION OF THE DRAWINGS

FIG. 1A shows an example of a configuration of the shaping system 10. FIG. 1B shows an example of a configuration of a main part of a shaping apparatus 12 in the shaping system 10. FIG. 1C shows an example of a configuration of a head portion 102 in the shaping apparatus 12.

FIG. 2A shows an example of a configuration of a cross-section of the shaped object 50 together with the support layer 52. FIG. 2B shows an example of a configuration of a color cell 300. FIG. 2C shows an example of a more detailed configuration of a light reflecting region 152 and a region to be colored 154.

FIGS. 3A to 3C schematically show the color cell 300 from various points of view.

FIG. 4A shows an example of an operation of generating slice data indicating a shaped object. FIG. 4B shows an example of the operation for shaping a shaped object and the configuration of the shaped object that has been shaped.

FIGS. 5A and 5C are views describing the cause of visual recognition of the contoured region, and the like. FIGS. 5A and 5B are views describing the way the color appears in the shaped object formed without using the color cell 300. FIG. 5C is a view describing the way the color appears with respect to the region to be colored 154 of the present example.

DESCRIPTION OF EMBODIMENTS

Figure 1A:
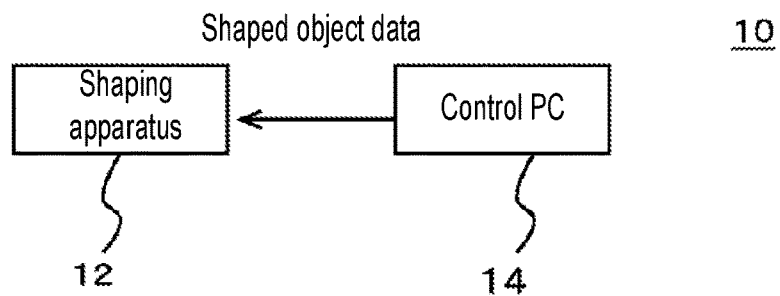
FIGS. 1A to 1C are views showing an example of a shaping system 10 according to one embodiment of the present disclosure.
Figure 1B:
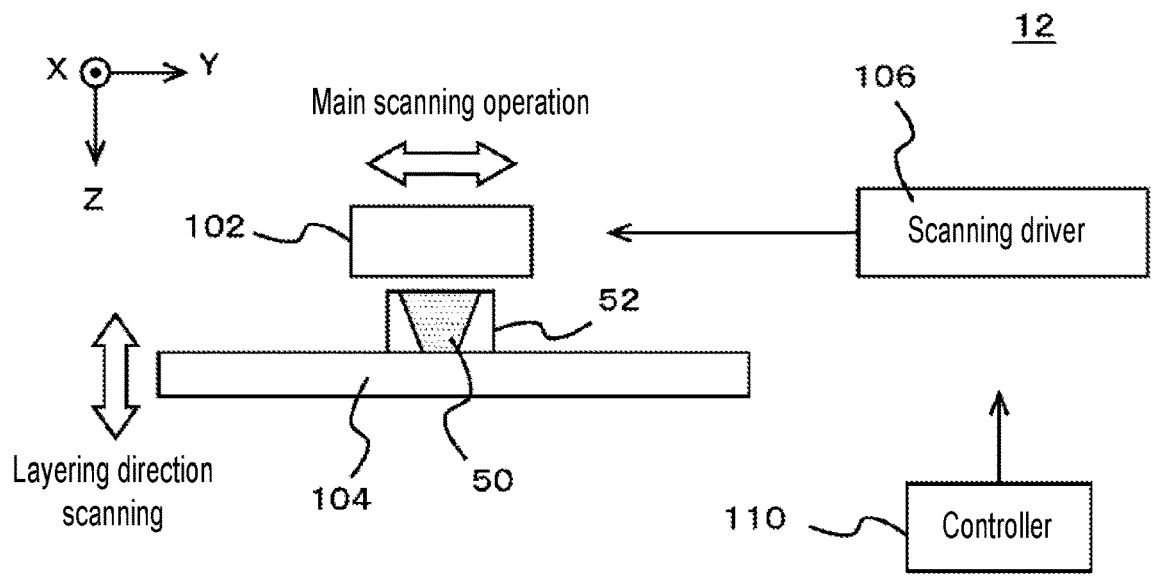
Figure 1C:
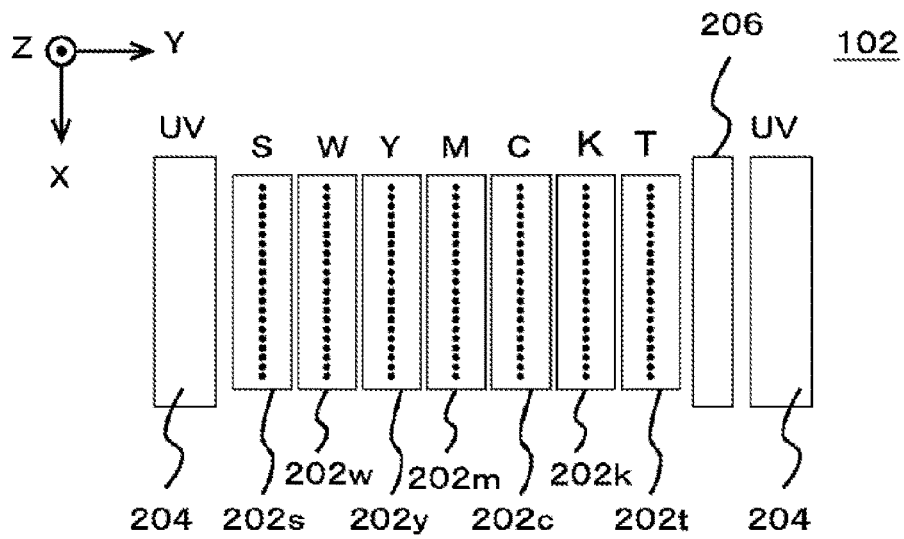

Hereinafter, an embodiment according to the present disclosure will be described with reference to the drawings. FIGS. 1A to 1C show an example of a shaping system 10 according to one embodiment of the present disclosure. FIG. 1A shows an example of a configuration of the shaping system 10. In the present example, the shaping system 10 is a shaping system for shaping a stereoscopic shaped object, and includes a shaping apparatus 12 and a control PC 14.

The shaping apparatus 12 is an apparatus (3D printer) for shaping a stereoscopic shaped object, and shapes the shaped object according to the control of the control PC 14. In this case, the shaped object is, for example, a stereoscopic three-dimensional structure shaped by the shaping apparatus 12. Furthermore, the shaping apparatus 12 is a full-color shaping apparatus capable of shaping a shaped object colored in full color, and receives shaped object data, which is data indicating a shaped object to be shaped, from the control PC 14, and shapes the shaped object based on the shaped object data. Moreover, in the present example, the shaping apparatus 12 is a shaping apparatus that shapes a stereoscopic shaped object 50 by a layered shaping method. In this case, the layered shaping method is, for example, a method of shaping the shaped object 50 by overlapping a plurality of layers. Furthermore, in the present example, the shaping apparatus 12 generates slice data indicating a cross-section of the shaped object based on the shaped object data, and ejects ink according to the slice data to form layers of respective inks forming the shaped object.

The control PC 14 is a computer (host PC) that controls the operation of the shaping apparatus 12 and provides shaped object data to the shaping apparatus 12 to control the shaping operation of the shaping apparatus 12. In this case, the control PC 14 provides, for example, shaped object data indicating a shaped object in which at least one part is colored to the shaping apparatus 12. Furthermore, more specifically, in the present example, the control PC 14 provides the shaped object data indicating a shaped object in which coloring is performed on the surface, where the hue can be visually recognized from the outside, to the shaping apparatus 12.

As described above, in the present example, the shaping system 10 is configured by a plurality of apparatuses, the shaping apparatus 12 and the control PC 14. However, in a modified example of the shaping system 10, the shaping system 10 may be configured by a single apparatus. In this case, for example, it is conceivable to configure the shaping system 10 with one shaping apparatus 12 having the function of the control PC 14.

Next, a specific configuration of the shaping apparatus 12 will be described. FIG. 1B shows an example of a configuration of a main part of the shaping apparatus 12. In the present example, the shaping apparatus 12 includes a head portion 102, a shaping table 104, a scanning driver 106, and a controller 110. Other than the points described below, the shaping apparatus 12 may have a configuration identical or similar to a known shaping apparatus. More specifically, other than the points described below, the shaping apparatus 12 may have a feature identical or similar to a known shaping apparatus that carries out shaping by ejecting a droplet to become the material of the shaped object 50 using an inkjet head. Furthermore, other than the illustrated configuration, the shaping apparatus 12 may also include, for example, various types of configurations necessary for shaping, and the like of the shaped object 50.

The head portion 102 is a part that ejects the material of the shaped object 50. Furthermore, in the present example, ink is used as the material of the shaped object 50. In this case, the ink is, for example, a functional liquid. Furthermore, in the present example, the ink can also be considered as, for example, a liquid or the like ejected from the inkjet head. More specifically, the head portion 102 ejects ink that cures according to predetermined conditions from a plurality of inkjet heads as a material of the shaped object 50. Then, the respective layers constituting the shaped object 50 are overlapped and formed by curing the ink after landing to shape the shaped object 50 by the layered shaping method. Moreover, in the present example, an ultraviolet curable ink (UV ink) that cures from a liquid state by irradiation of ultraviolet light is used as the ink. Further, the head portion 102 further ejects a material of a support layer 52 in addition to the material of the shaped object 50. The head portion 102 thereby forms the support layer 52 at a periphery of the shaped object 50, and the like as necessary. The support layer 52 is, for example, a layered structural object that supports at least a part of the shaped object 50 being shaped. The support layer 52 is formed as necessary at the time of shaping of the shaped object 50 and removed after the completion of the shaping.

The shaping table 104 is a table-shaped member that supports the shaped object 50 being shaped, and is disposed at a position facing the inkjet head in the head portion 102, and has the shaped object 50 being shaped placed on the upper surface thereof. Furthermore, in the present example, the shaping table 104 has a configuration in which at least the upper surface is movable in a layering direction (Z direction in the figure), and moves at least the upper surface in accordance with the progress of the shaping of the shaped object 50 by being driven by the scanning driver 106. In this case, the layering direction means, for example, a direction in which the material of the shaped object is layered in the layered shaping method. More specifically, in the present example, the layering direction is a direction orthogonal to a main scanning direction (Y direction in the figure) and a sub scanning direction (X direction in the figure) set in advance in the shaping apparatus 12.

The scanning driver 106 is a driver that causes the head portion 102 to perform a scanning operation of relatively moving with respect to the shaped object 50 being shaped. In this case, relatively moving with respect to the shaped object 50 being shaped means, for example, relatively moving with respect to the shaping table 104. Causing the head portion 102 to perform the scanning operation means, for example, causing the inkjet head of the head portion 102 to perform the scanning operation. Furthermore, in the present example, the scanning driver 106 causes the head portion 102 to perform a main scanning operation (Y scanning), a sub scanning operation (X scanning), and a layering direction scanning (Z scanning).

The main scanning operation is, for example, an operation of ejecting ink while relatively moving in the main scanning direction with respect to the shaped object 50 being shaped. In this example, the scanning driver 106 causes the head portion 102 to perform the main scanning operation by fixing the position of the shaping table 104 in the main scanning direction and moving the head portion 102 side. Furthermore, for example, the scanning driver 106 may move the shaped object 50 side by fixing the position of the head portion 102 in the main scanning direction and moving, for example, the shaping table 104. The sub scanning operation means, for example, an operation of relatively moving with respect to the shaped object 50 being shaped in the sub scanning direction orthogonal to the main scanning direction. More specifically, the sub scanning operation is, for example, an operation of relatively moving with respect to the shaping table 104 in the sub scanning direction by a feed amount set in advance. In the present example, the scanning driver 106 causes the head portion 102 to perform the sub scanning operation between the main scanning operations by fixing the position of the head portion 102 in the sub scanning direction and moving the shaping table 104. Furthermore, the scanning driver 106 may cause the head portion 102 to perform the sub scanning operation by fixing the position of the shaping table 104 in the sub scanning direction and moving the head portion 102.

The layering direction scanning is, for example, an operation of relatively moving the head portion 102 in the layering direction with respect to the shaped object 50 being shaped. Furthermore, the scanning driver 106 adjusts the relative position of the inkjet head with respect to the shaped object 50 being shaped in the layering direction by causing the head portion 102 to perform the layering direction scanning in accordance with the progress of the shaping operation. More specifically, in the layering direction scanning of the present example, the scanning driver 106 fixes the position of the head portion 102 in the layering direction and moves the shaping table 104. The scanning driver 106 may fix the position of the shaping table 104 in the layering direction and move the head portion 102.

The controller 110 is, for example, a CPU of the shaping apparatus 12, and controls the shaping operation of the shaped object 50 by controlling each portion of the shaping apparatus 12. Furthermore, in the present example, the controller 110 generates slice data based on the shaped object data received from the control PC 14. The slice data can be considered as, for example, data indicating the cross-section of the shaped object 50 at any position in the layering direction. Furthermore, in the present example, the controller 110 generates a plurality of pieces of slice data corresponding to layers of a plurality of inks constituting the shaped object 50. Then, in the operation of forming layers of respective inks constituting the shaped object 50, the controller 110 controls the operation of each inkjet head in the head portion 102, for example, to cause each inkjet head to eject the ink to use for the shaping of the shaped object 50. According to the present example, the shaped object 50 can be appropriately shaped. Moreover, the configuration of the shaped object 50 to be shaped in the present example will be described in detail later.

Next, the configuration of the head portion 102 in the shaping apparatus 12 will be described in more detail. FIG. 1C shows an example of a configuration of the head portion 102. In the present example, the head portion 102 includes a plurality of inkjet heads, a plurality of ultraviolet light sources 204, and a flattening roller 206. As shown in the figure, the plurality of inkjet heads include an inkjet head 202s, an inkjet head 202w, an inkjet head 202y, an inkjet head 202m, an inkjet head 202c, an inkjet head 202k, and an inkjet head 202t. The plurality of inkjet heads are, for example, arranged side by side in the main scanning direction with their positions in the sub scanning direction aligned. Furthermore, each inkjet head includes a nozzle row, in which a plurality of nozzles are arranged in a predetermined nozzle row direction, on a surface facing the shaping table 104. Furthermore, in the present example, the nozzle row direction is a direction parallel to the sub scanning direction.

Among the inkjet heads, the inkjet head 202s is an inkjet head that ejects the material of the support layer 52. For example, a known material for the support layer can be suitably used for the material of the support layer 52. The inkjet head 202w is an inkjet head that ejects ink of white color (W color). In this case, the inkjet head 202w is an example of a head for light reflective material. Furthermore, white ink is an example of an ink of light reflective color and light reflective material. The manner of using the white ink in the present example will be described in detail later.

The inkjet head 202y, the inkjet head 202m, the inkjet head 202c, and the inkjet head 202k (hereinafter referred to as the inkjet heads 202y to 202k) are inkjet heads for coloring used at the time of shaping the colored shaped object 50. More specifically, the inkjet head 202y ejects ink of yellow color (Y color). The inkjet head 202m ejects ink of magenta color (M color). The inkjet head 202c ejects ink of cyan color (C color). Furthermore, the inkjet head 202k ejects ink of black color (K color). In addition, in the present example, each color of Y, M, C, K is an example of process colors used for full color representation by a subtractive color mixing method. The inks of respective colors are an example of a colored material for coloring. Furthermore, each of the inkjet heads 202y to 202k is an example of a coloring head that ejects coloring materials of colors different from each other. Moreover, the coloring material can be considered as, for example, a material or the like used to color a region (region to be colored) to be colored in the shaped object 50 to a desired color.

The inkjet head 202t is an inkjet head that ejects a clear ink. The clear ink is, for example, an ink of colorless and transparent (T) clear color. Furthermore, clear ink is an example of a clear color material which is a non-colored translucent material. Moreover, in the present example, the inkjet head 202t is also an example of a coloring head. The clear ink is also an example of a coloring material.

The plurality of ultraviolet light sources 204 are light sources (UV light sources) for curing the ink, and generate an ultraviolet light for curing the ultraviolet curable ink. Moreover, in the present example, each of the plurality of ultraviolet light sources 204 is disposed on one end side and the other end side in the main scanning direction in the head portion 102 so as to sandwich the plurality of inkjet heads in between. For example, UVLED (ultraviolet LED) and the like can be suitably used for the ultraviolet light source 204. Furthermore, it is also conceivable to use a metal halide lamp, a mercury lamp, and the like for the ultraviolet light source 204. The flattening roller 206 is a flattening device for flattening the layer of ink formed during the shaping of the shaped object 50. Furthermore, for example, the flattening roller 206 flattens the layer of ink by coming into contact with a surface of the layer of ink and removing one part of the ink before curing at the time of the main scanning operation.

The layer of ink constituting the shaped object 50 can be appropriately formed by using the head portion 102 having the above configuration. Furthermore, the shaped object 50 can be appropriately shaped by forming the plurality of layers of inks in an overlapping manner. The specific configuration of the head portion 102 is not limited to the configuration described above and can be variously modified. For example, the head portion 102 may further include an inkjet head for colors other than the above as an inkjet head for coloring. In addition, the manner in which the plurality of inkjet heads are arranged in the head portion 102 can also be variously modified. For example, some of the inkjet heads may be disposed so as to be shifted in position in the sub scanning direction from the other inkjet heads.

Figure 2A:
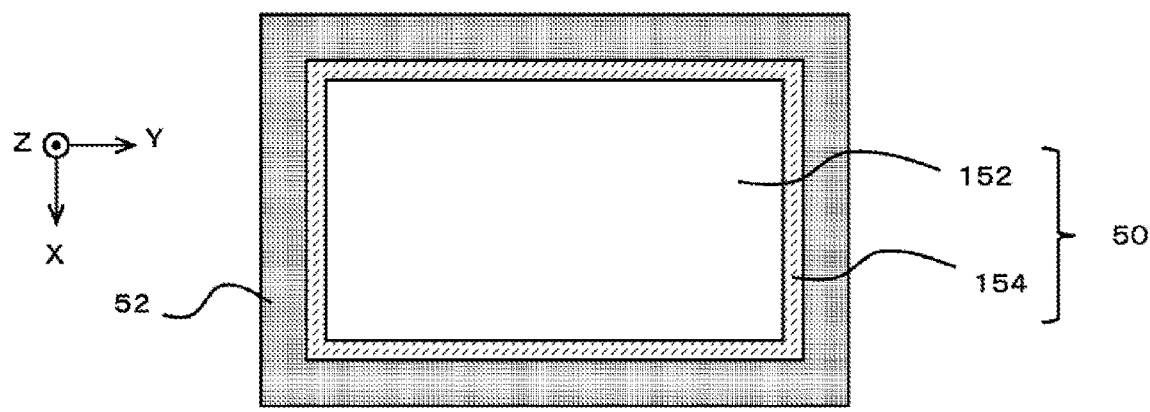
FIGS. 2A to 2C are views describing a configuration of a shaped object 50.

Now, the configuration of the shaped object 50 to be shaped in the present example will be described. FIGS. 2A to 3C are views describing a configuration of the shaped object 50. FIG. 2A shows an example of a configuration of a cross-section of the shaped object 50 to be shaped in the present example, together with the support layer 52. Furthermore, as shown in the figure, the illustrated cross-section is an X-Y cross-section perpendicular to the Z direction. In this case, the configuration of the Z-X cross-section and the X-Y cross-section of the shaped object 50 perpendicular to the Y direction and the Z direction also have a similar configuration.

As described above, in the present example, the shaping apparatus 12 shapes the shaped object 50 using the inkjet heads 202y to 202k (see FIGS. 1A to 1C) and the like. The shaped object 50 in which the surface is colored is, for example, thereby shaped. In this case, when referring to the surface of the shaped object 50 being colored, this means that, for example, at least a part of the region where hue can be visually recognized from the outside in the shaped object 50 is colored. Furthermore, as shown in the figure, in the present example, when shaping a shaped object 50 in which the surface is colored, the shaping apparatus 12 shapes the shaped object 50 including the light reflecting region 152 and a region to be colored 154. Moreover, the support layer 52 is formed in the periphery of the shaped object 50, as necessary.

The light reflecting region 152 is a region formed on the inner side of the region to be colored 154 using a white ink, and reflects the light entering from the outside of the shaped object 50 when, for example, coloring the surface of the shaped object 50 in full color representation. The full color representation is, for example, representation of a color performed by a possible combination of the subtractive color mixing method by inks of process colors. Furthermore, in the present example, a region that also serves as an inner region of the shaped object 50 is formed as the light reflecting region 152. In this case, the inner region is the region inside the shaped object 50 that constitutes the shape of the shaped object 50. In the modified example of the shaped object 50, the inner region may be formed as a region different from the light reflecting region 152. In this case, for example, the inner region can be formed using any ink other than the material of the support layer 52.

The region to be colored 154 is a region to be colored with coloring ink ejected from the inkjet heads 202y to 202k. Furthermore, as shown in the figure, in the present example, the region to be colored 154 is formed at the periphery of the light reflecting region 152 so that the region to be colored 154 is formed only on the surface of the shaped object 50 in a layered manner along the surface shape of the shaped object 50. In addition, the region to be colored 154 is preferably formed on the surface of the shaped object 50 with a constant thickness.

Figure 2B:
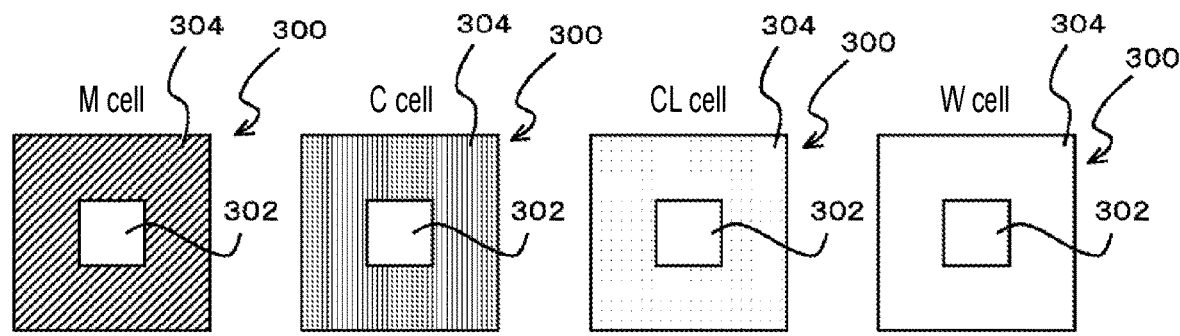
Figure 2C:
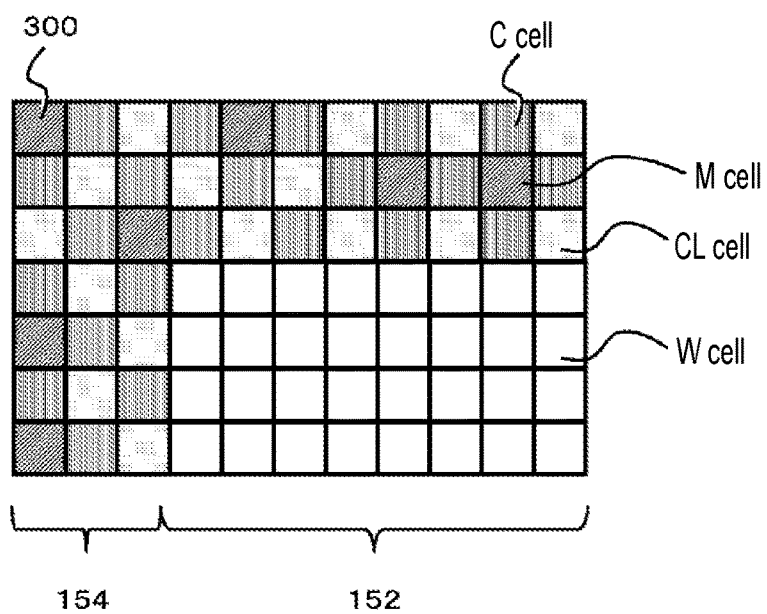
Figure 3A:
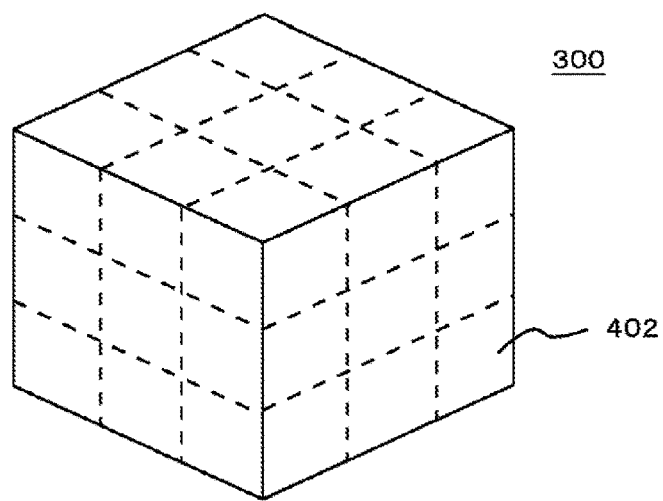
FIGS. 3A to 3C are views describing a configuration of the shaped object 50.
Figure 3B:
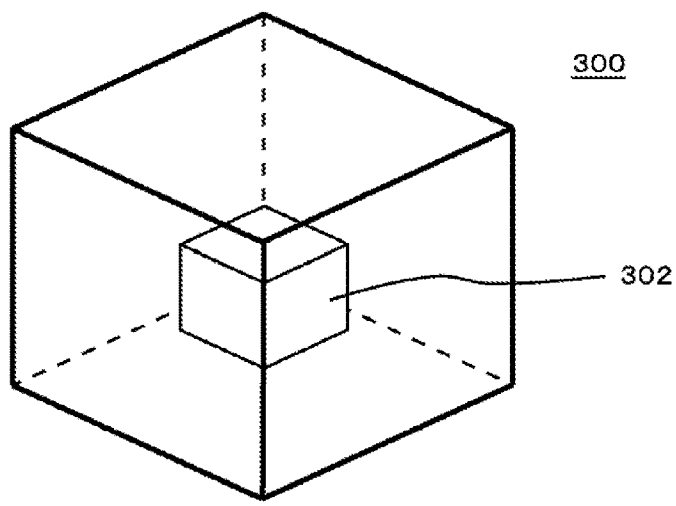
Figure 3C:
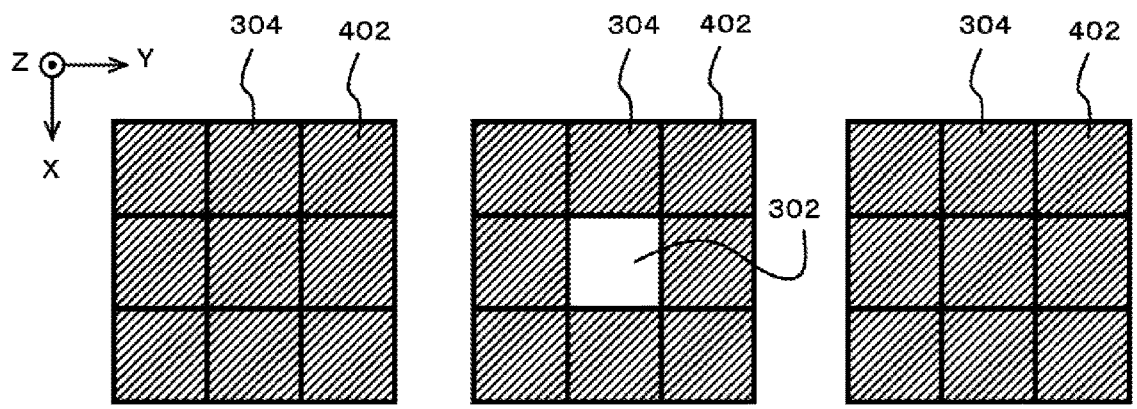

Furthermore, more specifically, in the present example, the light reflecting region 152 and the region to be colored 154 are formed, for example, in a configuration in which color cells 300, each of which is a unit of coloring set in advance, are arranged. FIG. 2B shows an example of a configuration of the color cell 300. FIG. 2C is a view showing an example of a more detailed configuration of the light reflecting region 152 and the region to be colored 154, and shows a state in which a plurality of color cells 300 are arranged in the light reflecting region 152 and the region to be colored 154 in a simplified manner. FIGS. 3A to 3C schematically show the color cell 300 from various points of view.

Here, the color cell 300 is, for example, a unit of coloring configured by a plurality of ink dots of a predetermined number. The color cell 300 can also be considered as, for example, a unit or the like set in advance so as to include a plurality of dots formed of the material of the shaped object 50. Furthermore, when the color cell 300 is configured by a plurality of ink dots, for example, a set of a plurality of ink dots can be handled as one color cell 300 in design. More specifically, as the color cells 300, for example, a configuration is used in which ink dots are arranged by a preset number in each of the main scanning direction, the sub scanning direction, and the layering direction. Furthermore, more specifically, in the case of the present example, the number of dots arranged in each direction in one color cell 300 is three. Therefore, one color cell 300 is configured by a total of 27 (3×3×3) ink dots.

In this case, one ink dot can be considered as, for example, a dot formed by an ink ejected by any one nozzle of any one inkjet head to one ejection position set according to the resolution of shaping. Furthermore, the resolution of shaping can be considered as, for example, a resolution for specifying the ejection position of the ink at the time of the shaping operation. Moreover, in the main scanning direction and the sub scanning direction, the resolution of shaping can be considered as, for example, the resolution of the position to which the ink is ejected in the operation of forming one layer of ink. In addition, in the layering direction, the resolution of shaping can be considered, for example, as the resolution corresponding to the interval of the layers of ink to layer.

In this case, one ink dot can be considered as a configuration or the like corresponding to a voxel set in correspondence with the resolution of shaping. In this case, a voxel is a stereoscopic pixel constituting each position of the shaped object 50 in accordance with the resolution of shaping. Then, in this case, one color cell 300 can be considered as, for example, being constituted by 27 voxels 402 as shown in FIG. 3A.

Furthermore, as described above, the color cell 300 is configured of a plurality of ink dots. Therefore, in the present example, in addition to the resolution (resolution of dot) with respect to the arrangement of ink dots, it can also be considered as the resolution (resolution of color cell) with respect to the arrangement of the color cells 300. In this case, the resolution of the color cell is a resolution lower than the resolution of the dot in accordance with the number in which the ink dots are arranged in each method in one color cell 300. More specifically, as described above, in the color cell 300 of the present example, three ink dots are arranged in each of the main scanning direction, the sub scanning direction, and the layering direction. Therefore, in each direction of the main scanning direction, the sub scanning direction, and the layering direction, the resolution of the color cell 300 is ⅓ of the resolution of the dot.

In the present example, the color cell 300 includes a reflective core 302 and an outer peripheral portion 304, as shown, for example, in FIG. 2B. In this case, the reflective core 302 is a part formed of white ink inside the color cell 300. The outer peripheral portion 304 is a part surrounding the periphery of the reflective core 302. More specifically, in the present example, among the 27 ink dots constituting one color cell 300, the one ink dot located at the center position becomes the reflective core 302. Furthermore, the other 26 ink dots constitute the outer peripheral portion 304. According to this configuration, for example, a configuration of the smallest size can be appropriately realized as the color cell 300 including the reflective core 302 at the center.

Furthermore, in this case, when the color cell 300 is shown in a transparent manner so that the reflective core 302 inside can be seen, the reflective core 302 is configured by one ink dot at the position to become the center of the color cell 300, for example, as shown in FIG. 3B. Furthermore, in the color cell 300, when a cross-section corresponding to each layer of ink to be layered is shown, for example, as shown in FIG. 3C, the cross-section corresponding to the layer of ink at the center includes a voxel 402 configuring the reflective core 302 and a voxel 402 configuring the outer peripheral portion 304. Moreover, in the cross-section corresponding to the other layers of ink, only the voxels 402 constituting the outer peripheral portion 304 are included.

Furthermore, in the present example, the outer peripheral portion 304 in one color cell 300 is configured by ink dots of any one color. According to such a configuration, for example, the color of the color cell 300 can be appropriately set in accordance with the color of ink to use for shaping. More specifically, in this case, for example, as shown in FIG. 2B, the M cell which is the color cell 300 of M color can be configured by forming the outer peripheral portion 304 with ink of M color. Furthermore, a C cell which is the color cell 300 of C color can be configured by forming the outer peripheral portion 304 with ink of C color. Although the illustration is omitted, the color cell 300 (Y cell, K cell) of Y color or K color can be configured by forming the outer peripheral portion 304 with Y color or K color. Furthermore, in the present example, a CL cell and a W cell which are color cells 300 of clear color and white color are further used. In this case, the CL cell can be configured by forming the outer peripheral portion 304 with clear ink. Furthermore, by forming the outer peripheral portion 304 with a white ink, a W cell can be configured. Moreover, the color cell 300 having such a configuration, for example, can be configured as a dot in which the reflective core 302 is at the center and the periphery thereof is coated with ink of any color (e.g., ink of each color of Y, M, C, K, white color, or clear color), and the like.

Furthermore, in this case, the W cell can be considered as, for example, a light reflective color cell in which both the reflective core 302 and the outer peripheral portion 304 are formed of white ink. In this case, the light reflecting region 152 can be formed, for example, by arranging the W cells as shown in FIG. 2C. According to such a configuration, for example, the light reflecting region 152 can be appropriately formed using a white ink.

Furthermore, for the region to be colored 154, for example, coloring with a desired color can be performed by arranging the color cells 300 of each color in accordance with the color to be colored to each part of the region to be colored 154. More specifically, FIG. 2C shows an example of the arrangement of the color cells 300 in the region to be colored 154 when coloring the region to be colored 154 using the C cell and the M cell. Furthermore, in this case, the position where the colored color cell 300 is not formed can be compensated by forming a part of the region to be colored 154 with the CL cell as necessary. Thus, when coloring various colors with respect to the region to be colored 154, for example, the color cells 300 can be arranged in a constant density with respect to each part of the region to be colored 154. Therefore, according to the present example, the coloring in various colors can be appropriately performed on the region to be colored 154.

In addition, as described above, in the present example, each color cell 300 includes the reflective core 302 formed of a white ink. Therefore, the region to be colored 154 includes white ink dots at a constant density. The reason for forming such a region to be colored 154 will be described in more detail later.

As described above, in the present example, the light reflecting region 152 is formed using the W cell in which both the reflective core 302 and the outer peripheral portion 304 are formed of white ink. In this case, it seems that there is no difference in the light reflecting region 152 from the case where white ink dots are simply arranged without using the color cell 300. However, when performing the control of the shaping operation without using the color cell 300 as a unit for the light reflecting region 152, the control of the operation of forming the light reflecting region 152 needs to be performed through a method different from the control of the operation for forming the region to be colored 154 configured by the color cell 300. In this case, it can be assumed that the control of the molding operation will become complex. On the other hand, in the present example, the light reflecting region 152 is also formed in units of color cells 300. Furthermore, the W cell configuring the light reflecting region 152 has the same size as the color cell 300 configuring the region to be colored 154. According to such a configuration, for example, the control of the shaping operation can be appropriately prevented from becoming complex by performing the processing related to the color cell 300 in the same or similar manner for the operation of forming the light reflecting region 152 and the region to be colored 154.

Furthermore, in a modified example of the operation of shaping the shaped object 50, consideration is made to shape a shaped object 50 further including a region other than the light reflecting region 152 and the region to be colored 154. In this case, it is preferable to define the color cell 300 corresponding to each region for all the regions. Furthermore, in this case, the color cells 300 of each region are preferably set to the same size. According to such a configuration, for example, each region of the shaped object 50 can be appropriately formed while appropriately preventing the control of the shaping operation from becoming complex. Furthermore, in this case, the color cell 300 of each region does not necessarily use a configuration including the reflective core 302 and may use a configuration corresponding to the required property of each region. More specifically, for example, when forming a transparent protective region or the like on the surface of the shaped object 50, for example, it is conceivable to use the color cell 300 formed of only clear ink dots as the color cell 300 for the protective region. Furthermore, when forming the support layer 52 at the time of shaping of the shaped object 50, it is preferable to define the corresponding color cell 300 for the support layer 52 as well. In this case, it is conceivable to use the color cell 300 formed of only the ink dot to become the material of the support layer 52, for example, as the color cell 300 for the support layer 52.

Now, the reason and the like for forming the region to be colored 154 using the color cell 300 as described above will be described in detail. First, for the sake of convenience of explanation, an operation and the like in the case of shaping a shaped object colored without using the color cell 300 as described above will be described.

Figure 4A:
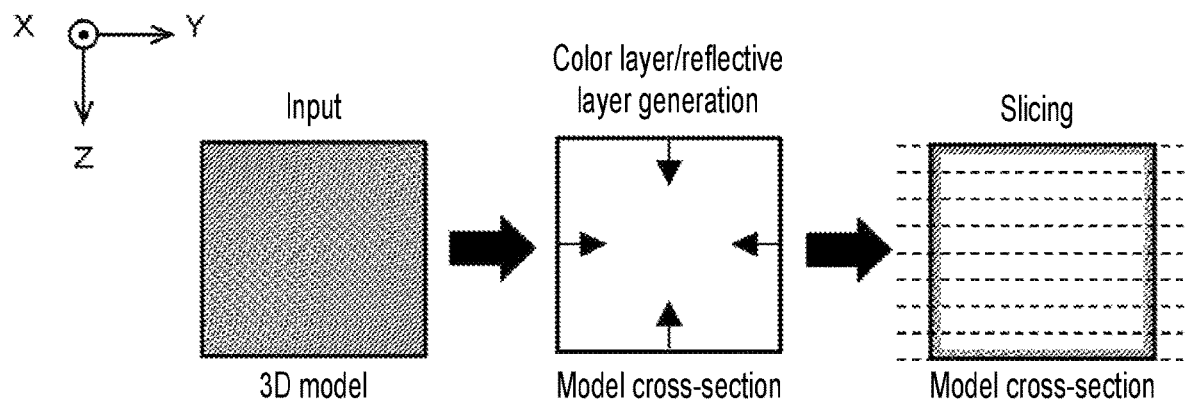
FIGS. 4A and 4B are views describing a shaped object formed without using the color cell 300.
Figure 4B:
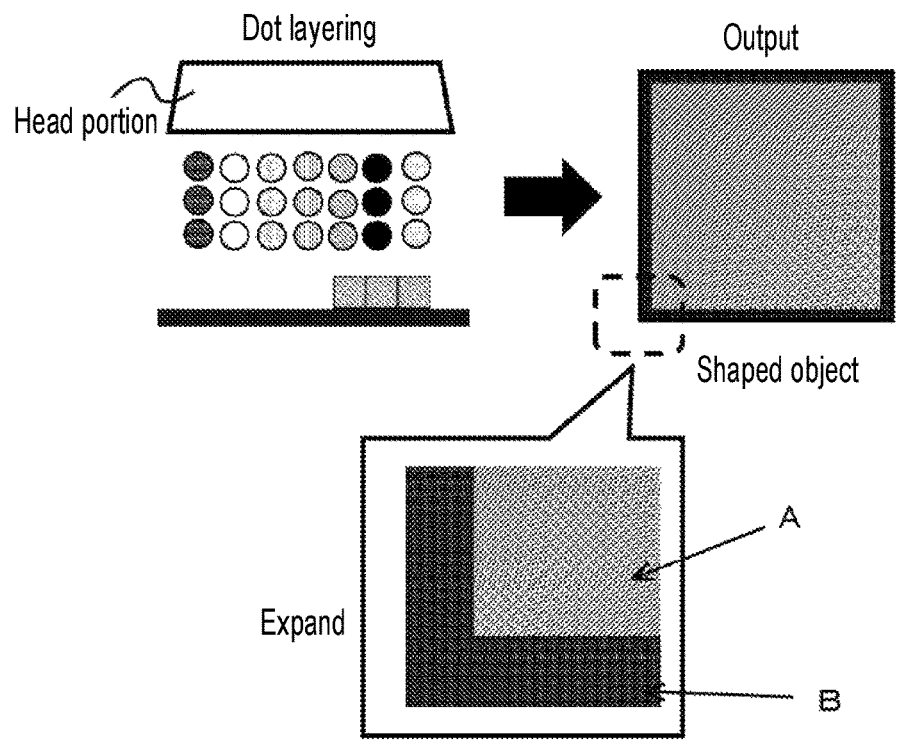

FIGS. 4A and 4B are views describing a shaped object shaped without using the color cell 300. FIG. 4A shows an example of an operation of generating slice data indicating a shaped object. When shaping a shaped object through the layered shaping method, shaped object data (3D model) indicating the entire shaped object is usually input, and the slice data indicating the cross-section of the shaped object is generated based on the shaped object data. Furthermore, in this case, as shown in the figure as the operation of color layer/reflection layer generation, the range to become the light reflecting region and the region to be colored is set. In this case, for example, a range to become the region to be colored is set so that a region to be colored having a predetermined thickness is formed based on the shaped object data indicating a shaped object in which the surface is colored. Moreover, a range to become the light reflecting region is set on the inner side of the range to become the region to be colored. More specifically, in this case, for example, the range to become the region to be colored is set such that the thickness in the normal direction of the surface of the shaped object becomes a predetermined thickness. The thickness of the region to be colored 154 may be, for example, about 150 μm (e.g., about 100 to 200 μm). Moreover, in order to represent a deeper color, it is preferable to further increase the thickness of the region to be colored. In this case, region to be colored is formed using ink of each color of Y, M, C, K (color ink) and clear ink in such a manner that the total amount of ink per unit volume becomes a predetermined amount. Moreover, the range to become the light reflecting region is set on the inner side of the range to become the region to be colored.

Furthermore, in this case, as shown as an operation of slicing in the figure, a plurality of pieces of slice data each indicating a cross-section (model cross-section) of a shaped object at each position in the layering direction are generated by slicing data at predetermined intervals. Moreover, in this case, the slice data indicating a position to eject the ink of each color to use for shaping is generated by further performing separation processing, RIP processing and the like in accordance with the color of the ink to use for shaping. Then, for example, as shown in FIG. 4B, the shaped object is shaped by ejecting the ink of each color from each inkjet head of the head portion based on the generated slice data. FIG. 4B shows an example of the operation for shaping a shaped object and the configuration of the shaped object that has been shaped.

With such a configuration, for example, a shaped object in which the surface is colored can be appropriately shaped. However, in this case, the way the color appears may differ according to the position of the shaped object due to the configuration in which the light reflecting region is formed on the inner side of the region to be colored. More specifically, in the case shown in FIG. 4B, on the surface of the shaped object, a part where the way the color appears is different is formed, as indicated by reference symbols A and B in the figure showing a part of the shaped object in an enlarged manner. The part denoted with the reference symbols A and B are parts colored with the same color. Moreover, in this case, the part denoted with the reference symbol A appears like the same color in the planar region including the periphery. On the other hand, the part denoted with the reference symbol B, which is a region surrounding the part denoted with the reference symbol A, appears different in color from the part denoted with the reference symbol A. As a result, when the surface of the shaped object is observed, an unintended contoured region is visually recognized.

However, when such an unintended contoured region is visually recognized, the desired coloring with respect to the shaped object is not performed, and the quality of the shaped object may be degraded. Therefore, the inventor of the present application investigated the cause of visual recognition of such a contoured region, and through of forming the region to be colored 154 using the color cell 300 as described above as a configuration in which such a phenomenon is less likely to occur.

Figure 5A:
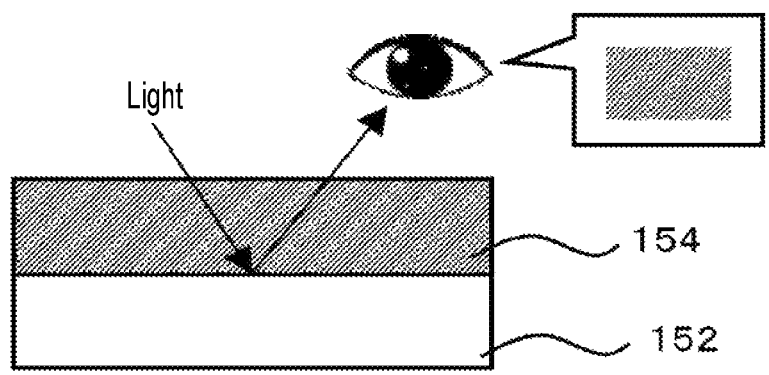
Figure 5B:
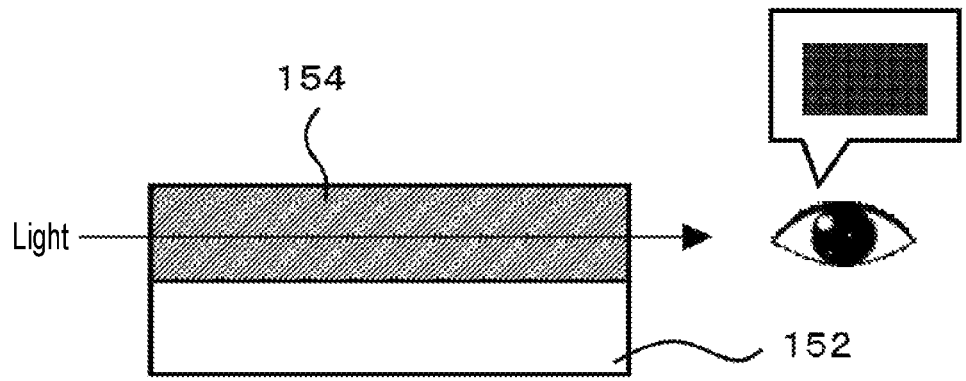
Figure 5C:
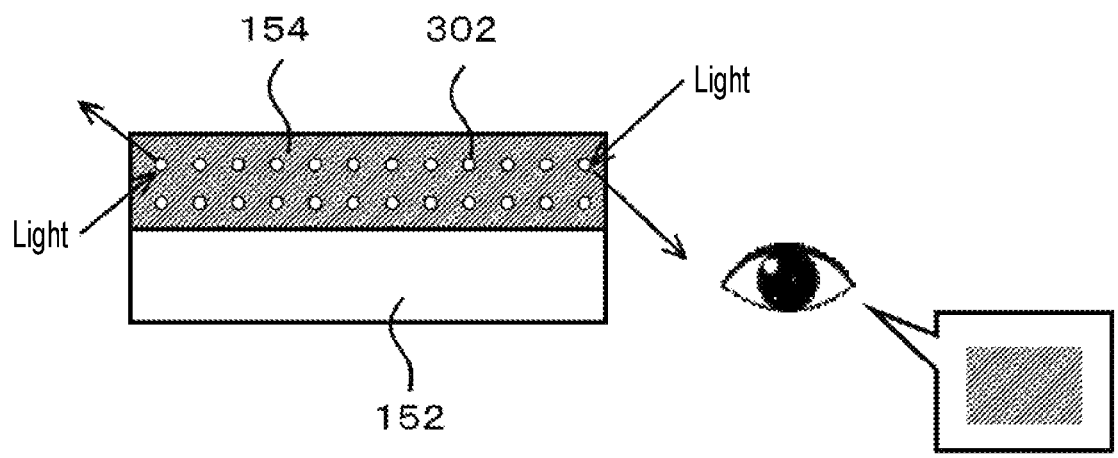

FIGS. 5A and 5C are views describing the cause of visual recognition of the contoured region, and the like. FIGS. 5A and 5B are views describing the way the color appears in a shaped object shaped without using the color cell 300, and schematically show the way the color corresponding to the parts denoted with reference symbols A and B in FIG. 4B is seen.

More specifically, when the shaped object is observed in a direction the light reflected by the light reflecting region 152 reaches the eye with respect to the part where the light reflecting region 152 and the region to be colored 154 are overlapped, as in the part denoted with the reference symbol A in FIG. 4B, the light reaching the eyes of the observer enters the region to be colored 154 from the outside of the shaped object, for example, as shown in FIG. 5A and becomes the light reflected by the light reflecting region 152. In this case, the distance the light passes through the region to be colored 154 is approximately twice the thickness of the region to be colored 154.

On the other hand, when the part denoted by the reference symbol B in FIG. 4B is observed, the light reaching the eyes of the observer is not, for example, the light reflected by the light reflecting region 152 as shown in FIG. 5B and contains much light passed through the region to be colored 154 along the surface of the shaped object. In this case, as the distance the light passes through the region to be colored 154 becomes long, it is visually recognized as dark color (deep color) by that much. Furthermore, as a result, as described above, when the surface of the shaped object is observed, an unintended contoured region is visually recognized.

On the other hand, in the present example, the region to be colored 154 is also provided with the function of reflecting light by forming the region to be colored 154 using the color cell 300 (see FIGS. 2A to 2C) including the reflective core 302. In this case, most of the light that entered the region to be colored 154 is reflected while the distance the light passes through the region to be colored 154 is less than or equal to a certain extent, for example, as shown in FIG. 5C. FIG. 5C is a view describing the way the color appears with respect to the region to be colored 154 of the present example.

More specifically, in the present example, as the reflective core 302 exists in each of the color cells 300 constituting the region to be colored 154, white ink dots uniformly exist in the region to be colored 154. In this case, as shown in the figure, most of the light that entered the region to be colored 154 is reflected at a position within a range of a certain extent from the surface of the shaped object. Therefore, according to the present example, for example, a large difference can be appropriately prevented from forming in the distance the light passes through the region to be colored 154. In addition, for example, a difference can be appropriately prevented from forming in the way the color appears according to the position of the shaped object.

Here, when considering to only give the function of reflecting light to the region to be colored 154, the region to be colored 154 does not necessarily need to be formed using the color cell 300, and it seems satisfactory to appropriately arrange the white ink dots within the region to be colored 154. However, in this case, excessive trial and error, complex processing, and the like may be required as to which position to arrange the white ink. On the other hand, in the present example, the reflective core 302 can be uniformly and appropriately distributed within the region to be colored 154 by using the color cell 300 including the reflective core 302.

Furthermore, in order to represent various colors using a colored color ink such as ink of each color of Y, M, C, and K for the region to be colored 154, for example, it becomes necessary to further use a clear ink and the like to compensate for the difference in the usage amount of the color ink caused by the difference in color. On the other hand, in the present example, as described above, the compensation for the position where the colored color cell 300 is not formed can be appropriately performed by using the CL cell which is the transparent color cell 300 in which the outer peripheral portion is formed with the clear ink. The coloring of the region to be colored 154 thus can be more appropriately carried out. Further, in this case, the reflective core 302 can be more uniformly and appropriately distributed in the region to be colored 154 by using the color cell 300 including the reflective core 302 also as the CL cell.

When configuring each region of the shaped object in units of color cells 300 as in the present example, processing such as processing for generating slice data can be executed without greatly changing the conventional processing. More specifically, in the conventional processing, for example, slice data is generated with a voxel resolution that is a resolution (dot resolution) with respect to the arrangement of ink dots as a reference. On the other hand, in the present example, consideration is made to perform at least a part of the processing for generating slice data with the resolution of the color cell as a reference. In this case, the processing can be performed in a manner identical or similar to the conventional processing by merely changing the resolution used as the reference. This point will be described in more detail below.

Figure 6:
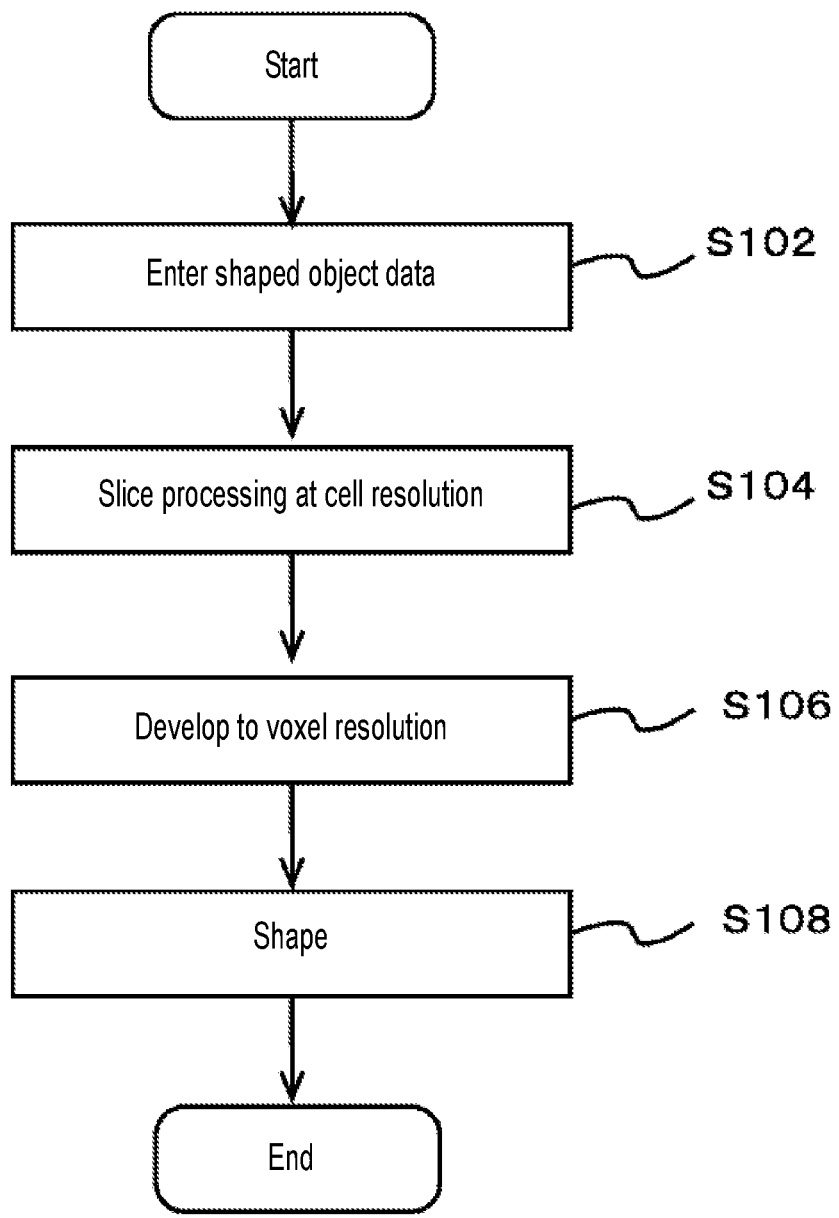
FIG. 6 is a flow chart showing an example of an operation of shaping the shaped object 50.

FIG. 6 is a flow chart showing an example of an operation of shaping the shaped object 50 (see FIGS. 1A to 1C) in the present example. As described above, in the shaping apparatus 12 (see FIGS. 1A to 1C) of the present example, the controller 110 (see FIGS. 1A to 1C) generates slice data based on the shaped object data. Furthermore, more specifically, in this case, for example, the shaping apparatus 12 inputs the shaped object data by receiving the shaped object data from the control PC 14 (see FIGS. 1A to 1C) (S102). Then, slice processing is performed at the cell resolution which is the resolution of the color cell based on the input shaped object data (S104). In this case, the slice processing at the cell resolution is a processing of generating data indicating the cross-section of the shaped object 50 with the cell resolution as a reference. Furthermore, this processing can be performed in a manner identical or similar to a known processing for generating slice data, for example, by merely changing the resolution used as a reference. In this case, the known processing for generating slice data is, for example, processing for generating slice data with a voxel resolution as a reference. In this case, data generated by the slice processing at the cell resolution can be considered, for example, as slice data at the cell resolution, and the like. Moreover, as slice data at cell resolution, for example, it is conceivable to generate data obtained by performing separation processing, RIP processing and the like according to the number of colors of the color cell.

Furthermore, in the present example, slice data at the voxel resolution is generated based on slice data at the cell resolution (S106). In this case, a plurality of pieces of slice data at the voxel resolution are generated from one slice data corresponding to the position of one cross-section at the cell resolution by developing the slice data at the cell resolution according to the difference between the cell resolution and the voxel resolution, the configuration of the color cell, and the like. More specifically, as described with reference to FIGS. 2A to 3C, when the color cells in which the number of dots arranged in each direction is three are used, one piece of slice data at the cell resolution is developed to three pieces of slice data at the voxel resolution. Then, for each of the three slice data at the voxel resolution, the resolution in the main scanning direction and the sub scanning direction is converted to three times the resolution in the slice data at the cell resolution. Furthermore, in this case, processing of specifying voxels corresponding to the reflective core in each color cell, and the like are performed in addition to the conversion of resolution and the like. More specifically, in this case, among the three slice data at the voxel resolution, the position of the voxel to become the reflective core is specified with respect to the slice data that becomes the middle in the layering direction. The voxel to become the reflective core is, for example, the central voxel in the range corresponding to each color cell. Furthermore, in this case, color conversion or the like is performed so as to specify the color of the voxel to become the reflective core as white. Moreover, in this case, for example, data specifying an ejection position at where ink of each color is to be ejected is generated as the slice data at the voxel resolution. According to such a configuration, for example, the slice data indicating the shaped object 50 in which a color is represented using the color cell can be appropriately generated.

Furthermore, in this case, the shaped object 50 is shaped by ejecting the ink from each inkjet head in the head portion 102 (see FIGS. 1A to 1C) based on the slice data at the voxel resolution (S108). More specifically, in this case, in the operation of forming a region to be colored in the shaped object 50 by controlling the operation of each portion of the shaping apparatus 12 based on the slice data, the controller 110 causes the inkjet head 202w (see FIGS. 1A to 1C) in the head portion 102 to eject white ink to form a reflective core in each color cell. In addition, the outer peripheral portion of each color cell is formed by causing the inkjet head for coloring of each color (e.g., inkjet heads 202y to 202k or inkjet head 202t) to eject coloring ink. According to the present example, for example, the shaped object 50 in which the color is represented using the color cells can be appropriately shaped.

Next, supplementary description and the like will be made regarding each configuration described above. In the above description, a case in which the ink of each color of Y, M, C, K and the clear ink are considered as a coloring material and the white ink is considered as a light reflective material has been mainly described. However, in the shaped object 50, for example, it may be considered to color a part of the region to be colored 154 white or the like. In such a case, the white ink can also be considered as an example of a coloring material. Furthermore, in this case, the white ink can be considered as an example of a coloring material and a light reflective material. Moreover, the inkjet head 202w that ejects the white ink can be considered to also serve as a coloring head.

In the above description a case in which the outer peripheral portion in one color cell is formed only with the ink of one color has been mainly described. With this configuration, for example, a color cell that indicates the color of the coloring ink can be appropriately formed. Furthermore, in this case, for example, various colors can be appropriately represented using color cells in the same or similar manner as in the case where color is represented using coloring ink as it is.

The outer peripheral portion of the color cell may be formed using, for example, inks of a plurality of colors. In this case, for example, with respect to at least some of the color cells in the region to be colored 154, it is conceivable to form the outer peripheral portion in one color cell with inks of a plurality of colors. According to such a configuration, for example, the color of the color cell can be a color obtained by mixing the inks of a plurality of colors. Furthermore, in this case, at the time of forming the outer peripheral portion in the color cell formed at each position of the region to be colored 154, for example, the controller 110 causes at least some of the plurality of inkjet heads in the head portion 102 to eject ink according to the color to be colored with respect to each position. According to such a configuration, for example, the color cells of various colors can be appropriately formed using inks of a plurality of colors.

More specifically, in this case, it is conceivable to form a color cell of red (R color), green (G color) and blue (B color), which are secondary colors, by forming the outer peripheral portion in one color cell using inks of two colors of Y, M, C, which are the primary colors in the subtractive color mixing method. Furthermore, it is also conceivable to adjust the color strength of the color cell by forming the outer peripheral portion in one color cell using the ink of each color of Y, M, C, K which is colored ink and the clear ink. Therefore, according to such a configuration, more various colors can be set for the color of the color cell itself. Moreover, for example, the region to be colored 154 can also be appropriately colored with more various colors.

Moreover, in the above description, an example of a configuration in a case in which the shaped object 50 includes only the light reflecting region 152 and the region to be colored 154 (see FIGS. 2A to 2C) has been mainly described for the configuration of the shaped object 50. However, in the modified example of the shaped object 50, the shaped object 50 may further include other regions. Furthermore, as described above, when forming the region to be colored 154 using a color cell including a reflective core, the region to be colored 154 having a function of reflecting light is formed. Therefore, in the modified example of the shaped object 50, consideration is also made to not form the light reflecting region 152. In this case, for example, it is conceivable to form the region on the inner side of the shaped object 50 by a configuration that does not function as the light reflecting region 152. Even when configured in such a manner, the light entering the region to be colored 154 from outside the shaped object 50 can be appropriately reflected. Moreover, for example, various colors thus can be appropriately represented by the region to be colored 154. In addition, when not forming the light reflecting region 152, for example, consideration is made to form the region to be colored 154 that also serves as a region inside the shaped object 50. In this case, it can also be considered that the shaped object 50 is colored to the inside.

INDUSTRIAL APPLICABILITY

The present disclosure can be suitably used in, for example, a shaping apparatus.

What is claimed is:
1. A shaping apparatus for shaping a shaped object that is stereoscopic and in which at least one part is colored, the shaping apparatus comprising:
 a coloring head that ejects a coloring material as a material of the shaped object;

a light reflective material head that ejects a light reflective material as a material of the shaped object; and
a controller that controls operations of the coloring head and the light reflective material head,
wherein the shaped object including a region to be colored, which is a colored region, is shaped as the shaped object,
at least a part of the region to be colored is formed by arranging a plurality of color cells set in advance as a unit of coloring,
each of the color cells includes:
  a reflective core which is a part formed of the light reflective material inside the color cell, and
  an outer peripheral portion which is a part that surrounds a periphery of the reflective core, and
in an operation of forming the region to be colored, the controller causes the light reflective material head to eject the light reflective material to form the reflective core in each of the color cells, and causes the coloring head to eject the coloring material to form the outer peripheral portion in each of the color cells;
wherein the shaping apparatus shapes the shaped object by layering the material of the shaped object in a layering direction set in advance,
a scanning driver that causes the coloring head and the light reflective material head to perform a scanning operation of relatively moving with respect to the shaped object being shaped is further disposed,
the scanning driver causes the coloring head and the light reflective material head to perform, as the scanning operation, at least:
  a main scanning operation of ejecting the material of the shaped object while relatively moving in a main scanning direction orthogonal to the layering direction with respect to the shaped object being shaped, and
  a layering direction scanning of relatively moving in the layering direction with respect to the shaped object being shaped,
when a direction orthogonal to the main scanning direction and the layering direction is assumed as a sub scanning direction, three voxels of the material of the shaped object are arranged in each of the main scanning direction, the sub scanning direction, and the layering direction in each of the color cells, and
in each of the color cells, the reflective core is constituted by one voxel of the material of the shaped object.

2. The shaping apparatus according to claim 1, further comprising:
a plurality of the coloring heads, each of the coloring head ejecting the coloring material of a color different from each other, wherein
at a time of forming the outer peripheral portion in the color cell formed at each position of the region to be colored, the controller causes at least a part of the plurality of coloring heads to eject the coloring material according to a color to be colored with respect to each position.

3. The shaping apparatus according to claim 2, wherein the outer peripheral portion of one of the color cells is formed only of the coloring material of one color.

4. The shaping apparatus according to claim 3, wherein as the shaped object, a shaped object including:
the region to be colored, and
a light reflecting region formed using the light reflective material on an inner side of the region to be colored is shaped.

5. The shaping apparatus according to claim 2, wherein in at least a part of the color cells in the region to be colored, the outer peripheral portion of one of the color cells is formed of the coloring material of a plurality of colors.

6. The shaping apparatus according to claim 5, further comprising:
a coloring head that ejects a material of a clear color as the coloring material as at least one of the plurality of coloring heads, wherein
the outer peripheral portion of the one of the color cells is formed of the coloring material of the plurality of colors including the material of the clear color.

7. The shaping apparatus according to claim 2, further comprising:
a coloring head that ejects a material of a clear color as the coloring material as at least one of the plurality of coloring heads, wherein
the color cell in which the outer peripheral portion is formed of only the material of the clear color is formed as at least a part of the color cells in the region to be colored.

8. The shaping apparatus according to claim 2, wherein as the shaped object, a shaped object including:
the region to be colored, and
a light reflecting region formed using the light reflective material on an inner side of the region to be colored is shaped.

9. The shaping apparatus according to claim 1, wherein as the shaped object, a shaped object including:
the region to be colored, and
a light reflecting region formed using the light reflective material on an inner side of the region to be colored is shaped.

10. A shaping method for shaping a shaped object that is stereoscopic and in which at least one part is colored, the shaping method comprising:
using a coloring head that ejects a coloring material as a material of the shaped object;
using a light reflective material head that ejects a light reflective material as a material of the shaped object;
shaping, as the shaped object, the shaped object including a region to be colored, which is a colored region; and
forming at least a part of the region to be colored by arranging a plurality of color cells set in advance as a unit of coloring,
wherein each of the color cells includes:
  a reflective core which is a part formed of the light reflective material inside the color cell, and
  an outer peripheral portion which is a part that surrounds a periphery of the reflective core, and
in an operation of forming the region to be colored, the light reflective material head is caused to eject the light reflective material to form the reflective core in each of the color cells, and the coloring head is caused to eject the coloring material to form the outer peripheral portion in each of the color cells;
wherein the shaping method shapes the shaped object by layering the material of the shaped object in a layering direction set in advance,
a scanning driver that causes the coloring head and the light reflective material head to perform a scanning operation of relatively moving with respect to the shaped object being shaped is further disposed,
the scanning driver causes the coloring head and the light reflective material head to perform, as the scanning operation, at least:

a main scanning operation of ejecting the material of the shaped object while relatively moving in a main scanning direction orthogonal to the layering direction with respect to the shaped object being shaped, and a layering direction scanning of relatively moving in the layering direction with respect to the shaped object being shaped, when a direction orthogonal to the main scanning direction and the layering direction is assumed as a sub scanning direction, three voxels of the material of the shaped object are arranged in each of the main scanning direction, the sub scanning direction, and the layering direction in each of the color cells, and in each of the color cells, the reflective core is constituted by one voxel of the material of the shaped object.

\* \* \* \* \*